(12) United States Patent
Crippa et al.

(10) Patent No.: US 7,184,348 B2
(45) Date of Patent: Feb. 27, 2007

(54) SENSING CIRCUIT FOR A SEMICONDUCTOR MEMORY

(75) Inventors: Luca Crippa, Busnago (IT); Rino Micheloni, Turate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/194,739

(22) Filed: Aug. 1, 2005

(65) Prior Publication Data

US 2006/0023531 A1 Feb. 2, 2006

(30) Foreign Application Priority Data

Aug. 2, 2004 (EP) .................... 04103714

(51) Int. Cl.
*G11C 7/02* (2006.01)

(52) U.S. Cl. ...................... 365/207; 365/210

(58) Field of Classification Search .............. 365/207, 365/210, 185.21, 203

See application file for complete search history.

(56) References Cited

U.S. PATENT DOCUMENTS

| | | | |
|---|---|---|---|
| 5,528,543 A * | 6/1996 | Stiegler | 365/207 |
| 5,815,452 A | 9/1998 | Shen | |
| 5,886,546 A * | 3/1999 | Hwang | 327/103 |
| 6,191,979 B1 * | 2/2001 | Uekubo | 365/185.25 |
| 6,366,497 B1 * | 4/2002 | Guliani et al. | 365/185.21 |
| 2002/0186586 A1 | 12/2002 | Conte et al. | |

FOREIGN PATENT DOCUMENTS

DE         101 56 728         6/2003

OTHER PUBLICATIONS

European Search Report dated Feb. 23, 2005 for European Application No. 04103714.

* cited by examiner

*Primary Examiner*—Anh Phung
(74) *Attorney, Agent, or Firm*—Lisa K. Jorgenson; Stephen Bongini; Fleit, Kain, Gibbons, Gutman, Bongini & Bianco P.L.

(57) ABSTRACT

A sensing circuit is provided for sensing semiconductor memory cells. The sensing circuit includes at least one first circuit branch, a feedback-controlled circuit element in the first circuit branch, a current-to-voltage conversion circuit in the first branch, and at least one comparator. The first circuit branch is coupled to a memory cell to be sensed so as to be run through by a current corresponding to a memory cell state. The feedback-controlled circuit element controls a memory cell access voltage, and the current-to-voltage conversion circuit converts the current into a corresponding converted voltage signal that is indicative of the memory cell state. The comparator compares the converted voltage signal with a comparison voltage for discriminating among at least two different states of the memory cell. The converted voltage signal corresponds to a control signal of the feedback-controlled circuit element. Also provided is a method of sensing a memory cell.

20 Claims, 6 Drawing Sheets

SENSING CIRCUIT FOR A SEMICONDUCTOR MEMORY

CROSS-REFERENCE TO RELATED APPLICATIONS

This application is based upon and claims priority from prior European Patent Application No. 04103714.4, filed Aug. 2, 2004, the entire disclosure of which is herein incorporated by reference.

FIELD OF THE INVENTION

The present invention generally relates to the field of semiconductor memories, either stand-alone or embedded in more complex Integrated Circuit (IC) electronic systems, and more specifically to an improved sensing circuit for a semiconductor memory.

BACKGROUND OF THE INVENTION

A conventional sensing circuit (also referred to as a sense amplifier) 100 used in semiconductor memories, particularly non-volatile semiconductor memories and, even more particularly, in those memories having a memory cell matrix with the so-called NOR architecture, has the general structure depicted in FIG. 1. The memory, for example a Flash memory, includes a bi-dimensional array 105 (the memory cell matrix, or memory matrix) of matrix memory cells MC, typically MOS transistors having a charge-storage element, e.g., a floating gate, that is adapted to be selectively charged with electric charges (electrons) so as to vary the MOS transistor's threshold voltage. The matrix memory cells are arranged by rows and columns, and are each connected to a respective matrix word line WL and matrix bit line BL,m.

A generic matrix memory cell MC,m is selected, e.g., for reading its content, by selecting the respective word line and bit line, respectively through a word line selector 110 and a bit line selector 115, which are responsive to an address ADD supplied to the memory, e.g., from the outside, such as from an external microcontroller (not shown). The matrix bit line BL,m that contains the one matrix memory cell selected for reading is electrically connected (through the bit line selector 115) to a first circuit branch 120a of the sense amplifier 100; the first circuit branch 120a is thus run through by a matrix memory cell current I,m. The first circuit branch 120a contains a load Lda that is tied to a supply voltage distribution rail VDD that distributes, through the memory IC chip, the supply voltage VDD provided to the IC chip from the outside, and, in series with the load LDa, a bit line voltage regulator 130a. The bit line voltage regulator typically comprises a cascode-connected N-channel MOSFET N11a, which is inserted between the load LDa and the matrix bit line BL,m. The cascode-connected MOSFET N11a is feedback-controlled, by being inserted in a negative feedback network, typically comprising an inverter IN1a, which has its input and output respectively connected to the source and the gate of the cascode-connected MOSFET N11a.

The sense amplifier 100 comprises at least one second circuit branch 120b, which is intended to be run through by a respective reference current I,r. One second circuit branch is sufficient in the case in which the memory includes bi-level memory cells (i.e., memory cells whose threshold voltage can take either one of two possible values), which are capable of storing one bit each, or also in the case of multi-level memory cells (whose threshold voltage can take more than two values), which are adapted to store more than one bit each, provided that a serial, particularly a serial dichotomic sensing approach, is adopted for sensing the multi-level memory cells. More than one second circuit branch may be necessary in some cases, for example in a case in which the sense amplifier is intended to sense multi-level memory cells, and a parallel sensing approach is adopted. The second circuit branch 120b is typically identical to the first circuit branch 120a, and contains a load Ldb, which is tied to the supply voltage distribution rail VDD, and, in series with the load LDb, a bit line voltage regulator 130b comprising a cascode-connected N-channel MOSFET N11b, which is inserted in a negative feedback network, which comprises an inverter IN1b having its input and output respectively connected to the source and the gate of the MOSFET N11b. The N-channel MOSFET N11b is inserted between the load LDb and a reference bit line BL,r, which contains a reference memory cell MC,r that is structurally identical to the matrix memory cells MC,m, but set in a well-known programming state (more than one such reference memory cell is typically used in the case in which the sense amplifier is intended for sensing multi-level memory cells).

The loads LDa and LDb act as current-to-voltage conversion elements, for respectively converting the matrix memory cell current I,m, and the reference current I,r into respective voltage signals. The loads LDa and LDb can be implemented by resistors, transistors (e.g., P-channel MOSFETs), current loads and the like.

The bit line voltage regulators 130a and 130b regulate the voltage of the matrix bit line BL,m and that of the reference bit line BL,r (and thus the drain potential of the matrix and reference memory cells MC,m and MC,r; for this reason, they are also referred to as drain voltage regulators) to approximately 1V, a value that avoids stressing the memory cells (matrix and reference) and causing spurious "soft-programming" thereof.

Circuit nodes MAT and REF, corresponding to the drains of the MOSFETs N11a and N11b, respectively, are connected to the non-inverting and inverting inputs of a comparator or differential amplifier 125, which is adapted to amplify a voltage difference between these two circuit nodes MAT and REF substantially to a full logic-level voltage.

An output of the differential amplifier 125, which carries the data bit stored in the memory cell, is fed to output data buffers of the memory (not shown) for being made available to the outside of the memory.

In the case in which the memory contains multi-level memory cells and the parallel sensing approach is adopted, as many comparators as the number of second circuit branches are provided, and their outputs are fed to a combinational logic circuit that is capable of extracting the read multi-bit data from the outputs of the various comparators.

In a sensing operation, the selected matrix bit line BL,m is normally pre-charged to a predetermined potential. During this phase, the potential of the selected matrix word line WL to which the selected matrix memory cell MC,m belongs is also raised to a read word line potential, typically the supply voltage VDD, or possibly (when the value of the supply voltage VDD is low) a higher voltage, which is generated internally to the chip, for example by charge pumps.

At the end of the precharge phase, the potential at the nodes MAT and REF evolves dynamically. In particular, assuming that the two loads LDa and LDb are substantially equal (balanced loads), the evolution in time of the potential at the node MAT with respect to the node REF depends on whether the current I,m sunk by the matrix memory cell MC,m (whose value depends on the datum stored in the memory cell itself) is higher or lower than the reference current I,r (a similar reasoning also holds true in the case in which the loads LDa and LDb are not identical, i.e., they form unbalanced loads; in that case, the evolution in time of the potential at the node MAT with respect to the node REF depends on whether the current I,m is higher or lower than a predetermined fraction of the reference current I,r).

The potentials at the nodes MAT and REF are compared to each other by the differential amplifier 125, which amplifies an even slight potential difference to a full-swing logic signal.

The reference current I,r and the loads LDa and LDb are chosen in such a way that the potential at the node REF falls midway between the potential at the node MAT in the different possible programming states of the matrix memory cell (corresponding to different values of the matrix memory cell current I,m). Referring to FIG. 2A, the diagram shows the relationship between the values of the matrix memory cell current I,m and the reference current I,r, in the simple case of a bi-level memory. A horizontal axis I represents possible values of currents of the matrix memory cells and the reference currents. $I,m_{"1"}$ and $I,m_{"0"}$ are the average values of two statistical distributions of memory cell currents in the programming state "1" (usually corresponding to a lower threshold voltage $Vth_{"1"}$) and "0" (usually corresponding to a higher threshold voltage $Vth_{"0"}$). A reference current I,r intermediate between the two statistical distributions of currents ensures that the potential difference between the nodes MAT and REF is relatively large in either one of the two programming states ("1" or "0") of the memory cell to be sensed, and this increases the noise margin and the switching speed of the differential amplifier 125.

However, the separation between the potentials at the nodes MAT and REF of the sense amplifier finds a limit in the value of the supply voltage VDD. In principle, the voltage at the nodes MAT and REF may in fact swing from ground to the supply voltage VDD; from a practical viewpoint, however, the real voltage swing is lower. Due to the presence of the bit line voltage regulators 130a and 130b, the swing is limited to the range going from approximately 1V (the switching threshold of the inverter IN1a and IN1b) to the supply voltage VDD. Assuming that the memory IC supply voltage VDD is in the range from 2.7V to 3.6V, the worst-case maximum separation of the potentials at the nodes MAT and REF may be as low as 1.7V.

The situation is more critical in the case of multi-level memories. Referring to FIG. 2B, the diagram shows the relationship between the memory cell currents and the reference currents in the case of a four-level memory (a memory having memory cells capable of storing two bits). $Im_{"11"}$, $Im_{"10"}$, $Im_{"01"}$ and $Im_{"00"}$ represent the average values of statistical distributions of possible matrix memory cell currents values of current sunk by memory cells in each one of the four possible programming states, corresponding to the logic values "11", "10", "01" and "00", respectively. Given a same biasing condition, the matrix memory cell programmed to the logic value "11" presents a low threshold voltage, and then it sinks a high current $Im_{"11"}$; the current sunk by the memory cells decreases with the increase of their threshold voltage, until the current becomes very small (possibly zero) when the memory cell is programmed to the logic value "00". Ir1, Ir2 and Ir3 are values of reference currents used for discriminating the four possible programming states of the four-level memory cells. Each pair of adjacent logic values is discriminated by using the suitable reference current Iri (i=1,2,3); for example, the memory cell is considered to be programmed to the level "10" when its current is comprised between the reference current Ir2 and the reference current Ir1. For reading each selected memory cell, a parallel sense amplifier compares simultaneously the matrix memory cell current I,m with the three reference currents Ir1–Ir3.

Assuming as before that the supply voltage VDD is in the range from 2.7V to 3.6V, so that the worst-case maximum separation of the potentials at the nodes MAT and REF may be as low as 1.7V, this means that in this quite narrow voltage range seven different voltages need to be accommodated, corresponding to the seven different currents $Im_{"11"}$, $Im_{"10"}$, $Im_{"01"}$, and $Im_{"00"}$, and Ir1, Ir2 and Ir3. Thus, the separation between converted voltages at the nodes MAT and REF may be as low as 1.7V/6=283 mV; even worse, the real, statistical distribution of the currents, as depicted in FIG. 2B, further reduces the above voltage separation, leading to actual values as low as 50 mV.

Such low voltage differences cause the differential amplifier 125 to be slow in switching its output to either one or the other logic state, and to be very sensitive to noise.

The voltage difference between the nodes MAT and REF may be even lower in a case in which the supply voltage is reduced (supply voltages as low as 1.8V are becoming popular), and/or in the case of multi-level memories storing more than two bits per memory cell.

We have also observed that the presence of the loads LDa and LDb is not particularly advantageous, due to reasons of semiconductor chip area; in fact, the number of sense amplifiers needed in a semiconductor memory IC may be relatively high, and it would be desirable to keep the number of devices as low as possible.

Another known sensing circuit structure 300 is depicted in FIG. 3, in which elements identical or corresponding to those of FIG. 1 are identified by the same reference numerals. Different from the previously described structure, in this structure the bit line voltage regulators 130a and 130b are each connected in series to an input branch of a respective current mirror, which is comprised of a P-channel MOSFET P21a and P21b in diode configuration, and which mirrors the current I,m and I,r into a mirror branch of the current mirror, which is comprised of a P-channel MOSFET P22a and P22b, to which the load LDa and LDb is connected. The nodes MAT and REF, which are connected to the inputs of the differential amplifier 125, are represented by the drain electrode of the P-channel MOSFETs P22a and P22b, respectively, in the mirror branches.

The sense amplifier of FIG. 3, similarly to that of FIG. 1, is also affected by problems of limited voltage swing at the nodes MAT and REF. Since the current mirrors P21a and P22a and P21b and P22b work properly only if the P-channel MOSFETs P22a and P22b remain saturated, the swing of the voltage at the nodes MAT and REF is at best in the range from the ground voltage and the supply voltage VDD less the threshold voltage of the P-channel MOSFETs, which is approximately equal to 1V.

From the viewpoint of semiconductor chip area, we observed that the structure of FIG. 3 is instead worse than that of FIG. 1, because the four MOSFETs forming the two current mirrors need to be integrated in addition to the loads LDa and LDb.

SUMMARY OF THE INVENTION

In view of the problems described above, it is an object of the present invention to overcome these problems of the known sensing circuit structures.

Another object of the present invention is to overcome the problem of wasted semiconductor chip area that is inherent to the known structures.

Yet another object of the present invention is to overcome the problem of the scarce separation in voltage of the inputs to the differential amplifier, which is a consequence of the very limited voltage dynamic of the corresponding circuit nodes in the known sensing circuit structures.

One embodiment of the present invention provides a sensing circuit for sensing semiconductor memory cells. The sensing circuit includes at least one first circuit branch, a feedback-controlled circuit element in the first circuit branch, a current-to-voltage conversion circuit in the first branch, and at least one comparator. The first circuit branch is coupled to a memory cell to be sensed so as to be run through by a current corresponding to a memory cell state. The feedback-controlled circuit element controls a memory cell access voltage, and the current-to-voltage conversion circuit converts the current into a corresponding converted voltage signal that is indicative of the memory cell state. The comparator compares the converted voltage signal with a comparison voltage for discriminating among at least two different states of the memory cell. The converted voltage signal corresponds to a control signal of the feedback-controlled circuit element.

Another embodiment of the present invention provides a method for sensing a memory cell. According to the method, the memory cell to be sensed is caused to sink a memory cell current that is indicative of the memory cell state, by regulating an access voltage to the memory cell through a regulation element that is controlled by a regulation signal. The memory cell current is converted into a corresponding voltage signal, and the converted voltage signal is compared to at least one comparison voltage. The converted voltage signal is derived by the regulation signal that controls the regulation element.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
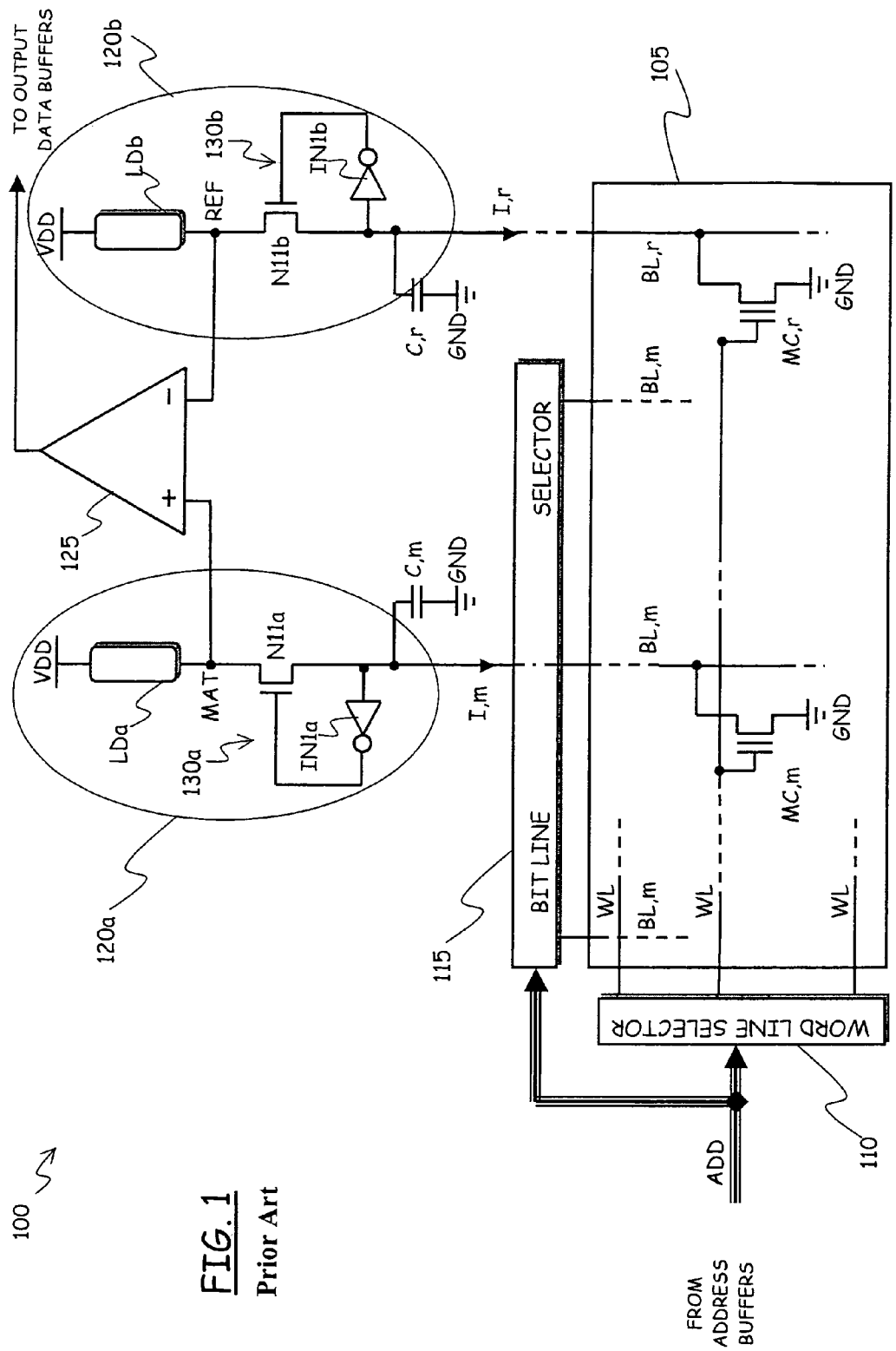
FIG. 1 shows a known sensing circuit structure.

Preferred embodiments of the present invention will be described in detail hereinbelow with reference to the attached drawings.

Preferred embodiments of the present invention provide a sensing circuit for sensing semiconductor memory cells. The sensing circuit includes at least one first circuit branch, a feedback-controlled circuit element in the first circuit branch, a current-to-voltage conversion circuit in the first branch, and at least one comparator. The first circuit branch is adapted to be operatively coupled to a memory cell to be sensed, so as to be run through by a current corresponding to a memory cell state. The feedback-controlled circuit element controls a memory cell access voltage, and the current-to-voltage conversion circuit is adapted to convert the current into a corresponding converted voltage signal that is indicative of the memory cell state. The comparator compares the converted voltage signal with a comparison voltage so as to discriminate among at least two different states of the memory cell. The converted voltage signal corresponds to a control signal of the feedback-controlled circuit element.

In one embodiment, the feedback-controlled circuit element also acts as the current-to-voltage conversion circuit. Thus, different from the known structures, it is not necessary to provide a current-to-voltage conversion circuit in addition to the feedback-controlled circuit element for converting the memory cell current into a voltage signal. Semiconductor chip area is thus saved.

A feedback network for controlling the feedback-controlled circuit element is preferably provided. The feedback network generates the control signal for the feedback-controlled circuit element.

According to one such preferred embodiment, the first circuit branch is connected between a supply voltage rail and a reference voltage rail, and the feedback network is adapted to generate the control signal so as to be variable in a voltage range wider than the supply voltage. Preferably, the feedback network includes a driver circuit element for the feedback-controlled circuit element, such as an inverting driver circuit element supplied by a higher voltage than the supply voltage, e.g., by a boosted voltage that is generated from the supply voltage.

In some embodiments, the sensing circuit is adapted to sense multi-level memory cells, in which case the comparison voltage comprises a plurality of comparison voltages for discriminating multiple memory cell states.

The present invention also provides a method for sensing a memory cell. According to the method, the memory cell to be sensed is caused to sink a memory cell current that is indicative of the memory cell state, by regulating an access voltage to the memory cell through a regulation circuit element that is controlled by a regulation signal. The memory cell current is converted into a corresponding converted voltage signal, and the converted voltage signal is compared to at least one comparison voltage. The converted voltage signal is derived from the regulation signal that controls the regulation circuit element.

Exemplary embodiments of the present invention will now be described in detail with reference to FIGS. 4–6.

Figure 3:
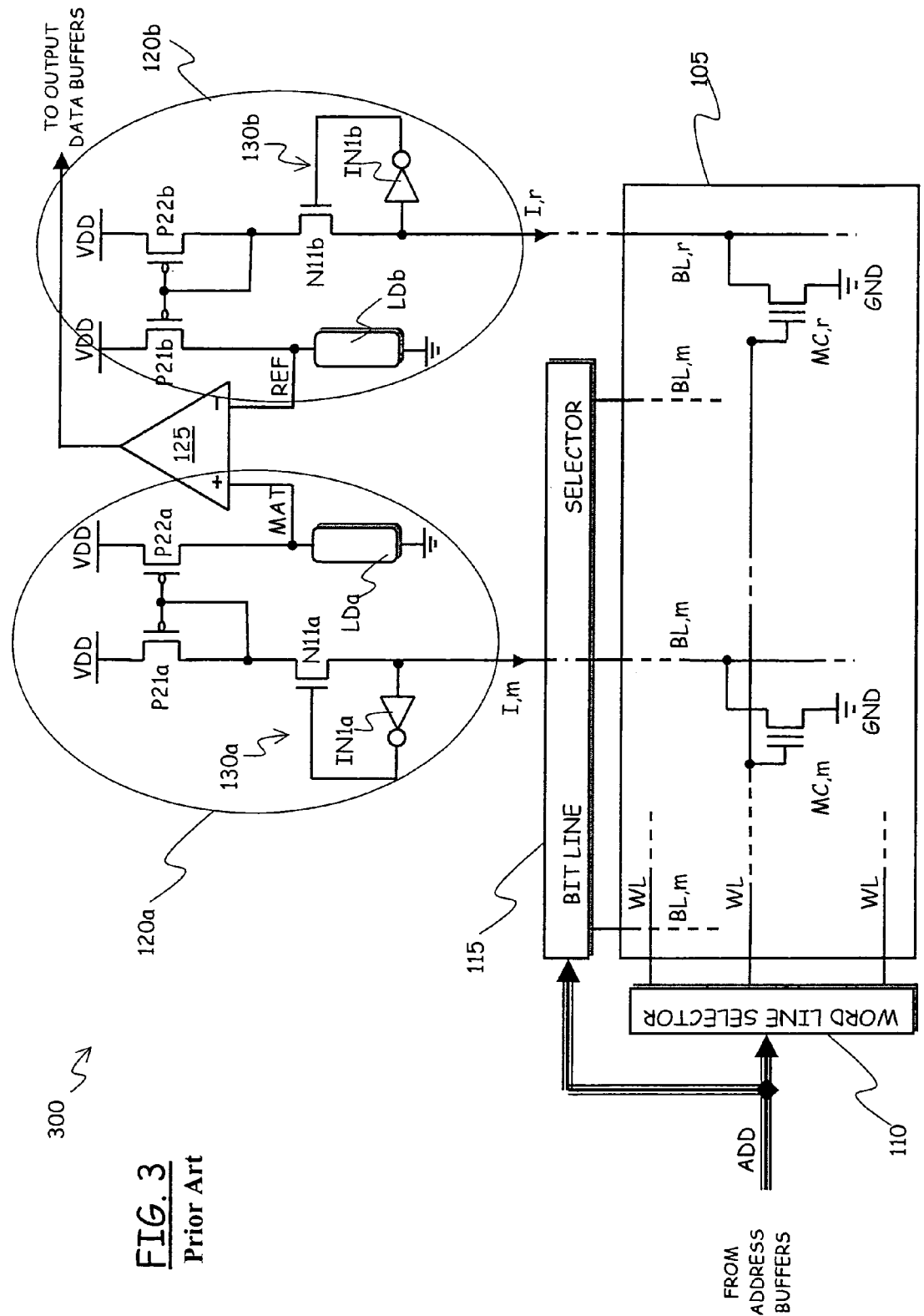
FIG. 3 shows another known sensing circuit structure.

As discussed above, we have observed that the known sensing circuit structures are affected by problems of wasted semiconductor chip area, due to the presence of the loads (and, possibly, of other circuit structures such as current mirrors, as in the structure of FIG. 3) that act as current-to-voltage converters.

Another problem that affects the known sensing circuit structures is the difficulty in discriminating between different programming states of the memory cells. In particular, this problem mainly derives from the limited voltage dynamic of the differential amplifier inputs, because such a voltage dynamic finds a limit in the value of the IC supply voltage VDD, and due to the fact that the value of the IC supply voltage VDD tends to become smaller and smaller. This problem is exacerbated in multi-level memories, in which several different voltage levels need to be accommodated (and discriminated) in a narrow voltage range.

We have observed that a possible solution to this problem may reside in supplying the current-to-voltage converters of the sense amplifier with a supply voltage higher than the IC supply voltage (VDD), i.e., by connecting the first and at least one second circuit branches 120a and 120b of the sense amplifier to a voltage higher than the IC supply voltage VDD. This can be done by providing a voltage booster, for example a charge-pump voltage booster (or using one of the charge-pump voltage boosters that are often provided on-board to semiconductor memories, particularly electrically programmable ones, for example for generating programming and/or erasing voltages). In particular, the loads LDa and LDb in the circuit branches of the sense amplifier structure of FIG. 1, and the P-channel MOSFETs P21a, P22a, P21b, and P22b of the current mirrors in the structure of FIG. 3, may be connected to a different voltage distribution line than the VDD voltage distribution rail VDD, with the different voltage distribution line distributing a boosted voltage generated by a voltage booster.

However, we observed that this solution has the problem that the current absorption by the sense amplifier would easily cause the boosted voltage to drop. In fact, voltage boosters based on charge pumps are known to exhibit a rather high output impedance, so that they are not adapted to sustain even relatively small current drainages. On the contrary, the sense amplifier sinks the current sunk by the matrix memory cell to be read (which, in the worst case, may have the highest value, $I,m_{"1"}$ or $I,m_{"11"}$), plus the dynamic current needed for charging a bit line parasitic capacitance C,m and C,r up to the voltage value determined by the bit line voltage regulators (typically, 1V). The current sunk by a memory cell in the "1" or "11" state (i.e., the non-programmed state) may be as high as 80 μA, and, typically, several memory cells in the memory are read simultaneously (i.e., in parallel with each other). For example, assuming that 70 memory cells are read at the same time (a rather typical sensing degree of parallelism), and that all the memory cells are in the "1" or "11" (i.e., non-programmed) state, the necessary current would be as high as 5.6 mA, plus the dynamic current needed to charge the bit line capacitances, typically on the order of some milliamperes, but with spikes as high as 30–40 mA, depending on the memory access time (considering the above-mentioned parallelism of the sensing operation).

Thus, the charge-pump voltage booster hypothetically used for generating the boosted supply voltage for the circuit branches 120a and 120b of the sense amplifiers would be required to deliver approximately 10 mA, with spikes as high as 30–40 mA. A voltage booster capable of delivering currents of this size would occupy a very large area on the semiconductor chip, with consequent problems in terms of production costs and process yield, and would have a significant current consumption.

Figure 4:
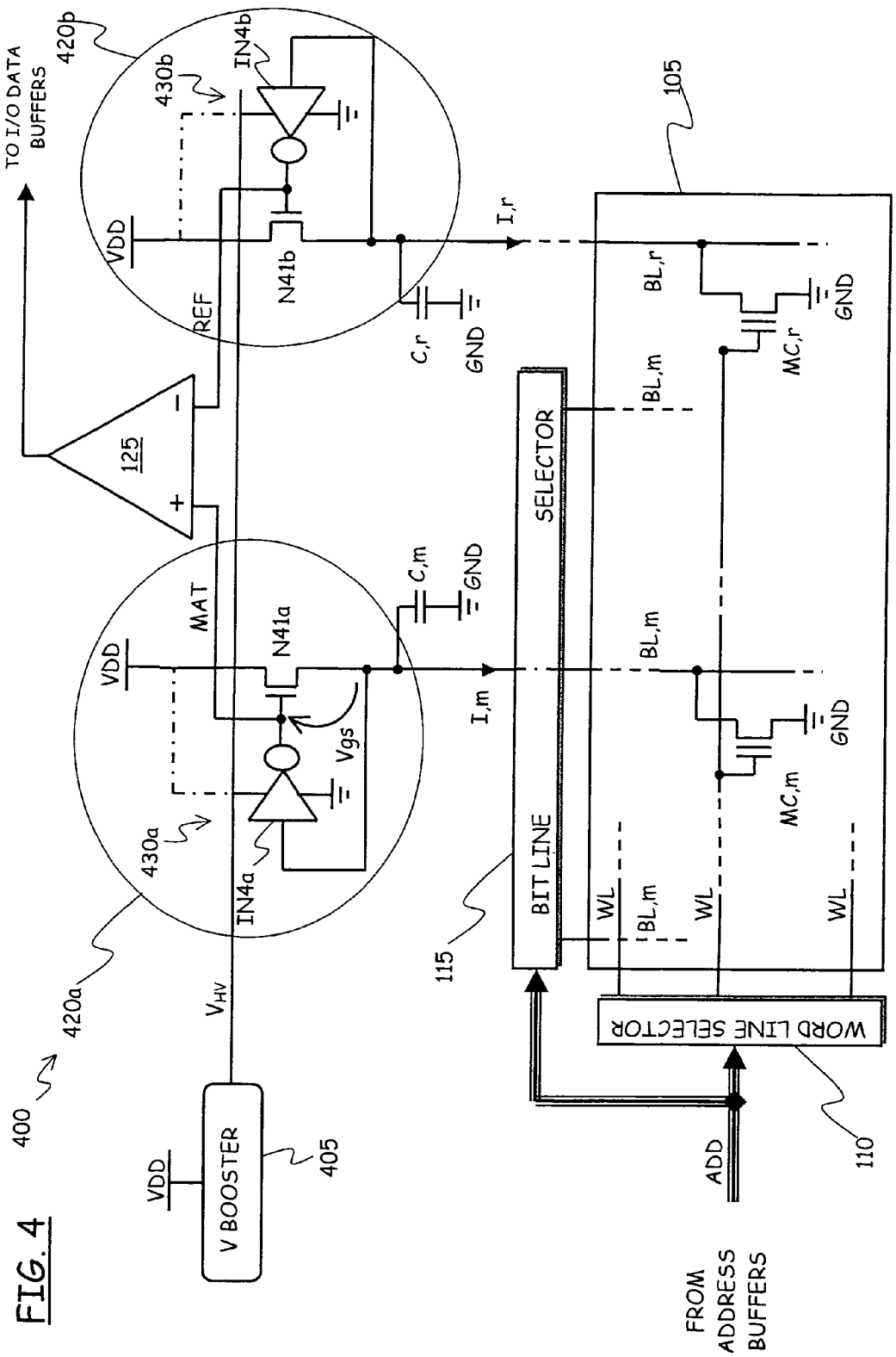
FIG. 4 shows a sensing circuit structure according to an embodiment of the present invention.

FIG. 4 shows a sensing circuit or sense amplifier structure 400 according to an embodiment of the present invention. In this drawing, elements identical to those of the structures shown in FIGS. 1 and 3 are identified by the same reference numerals.

Figure 2A:
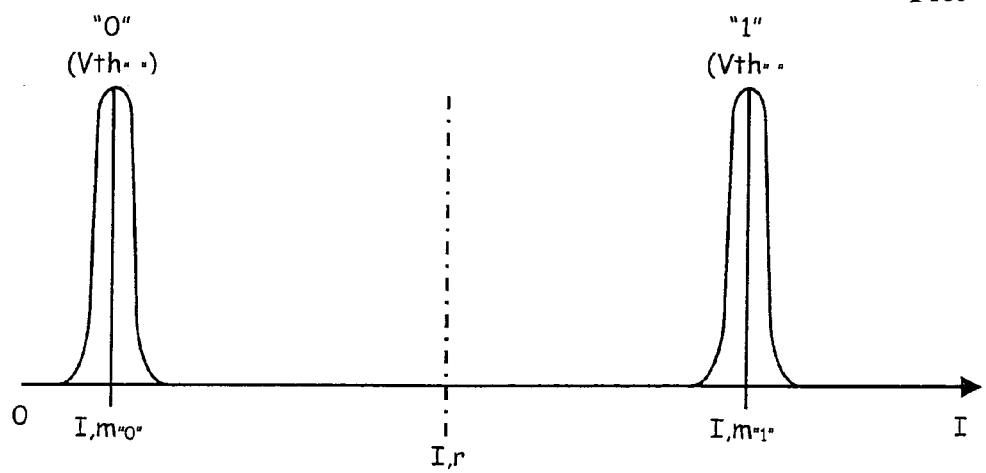
FIGS. 2A and 2B are diagrams showing distributions of memory cell currents and reference currents in the cases of two-level and four-level memory cells.
Figure 2B:
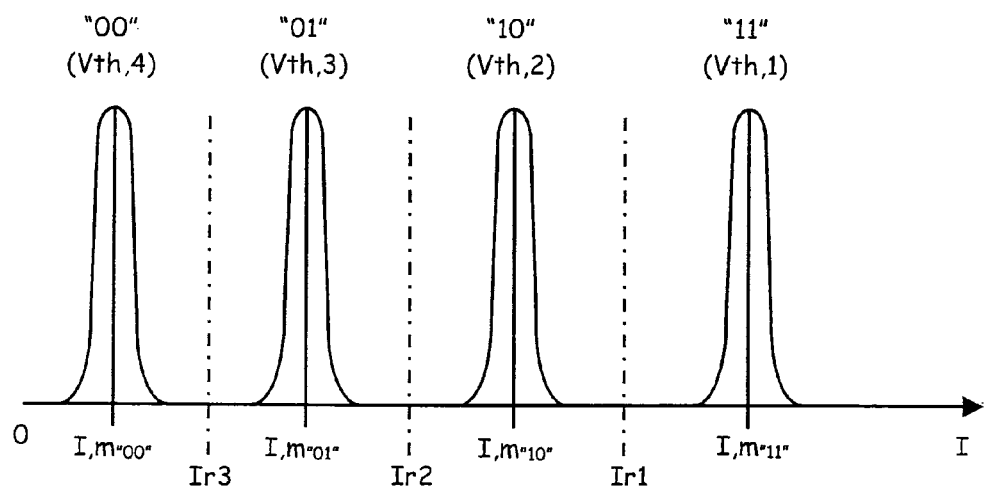

The selected matrix bit line BL,m is electrically connected (through the bit line selector 115) to a first circuit branch 420a of the sense amplifier, which, during a sensing operation, is thus run through by a matrix memory cell current I,m. The sense amplifier 400 comprises at least one second circuit branch 420b, intended to be run through by a respective reference current I,r (more than one second circuit branch may be provided in the case in which the sense amplifier is intended to sense multi-level memory cells and a parallel current comparison approach is adopted, according to which the matrix memory cell current is compared simultaneously with, for example, three reference currents—e.g., the three reference currents Ir1, Ir2 and Ir3 depicted in FIG. 2B).

The first circuit branch 420a contains a bit line voltage regulator 430a. The bit line voltage regulator 430a comprises a cascode-connected N-channel MOSFET N41a, which is inserted between the supply voltage distribution rail VDD and the selected matrix bit line BL,m. In particular, the MOSFET N41a has a drain connected to the supply voltage distribution rail VDD, and a source connected to the bit line (through the bit line selector 115). The cascode-connected MOSFET N41a is in turn inserted in a feedback network, particularly a negative feedback network, comprising for example an inverter IN4a, which has its input and output respectively connected to the source and to the gate of the MOSFET N41a.

In this embodiment of the present invention, the at least one second circuit branch 420b of the sense amplifier 400 is substantially identical to the first circuit branch 420a, and comprises a cascode-connected N-channel MOSFET N41b inserted between the supply voltage distribution rail VDD and the reference bit line BL,r. The cascode-connected MOSFET N41b is inserted in a feedback network, particularly a negative feedback network, comprising an inverter IN4b, which has its input and output respectively connected to the source and to the gate of the MOSFET N41b.

Contrarily to the known structures, the MOSFETs N41a and N41b are designed to be relatively resistive, i.e., to have relatively low conductivity.

In the known structures the cascode-connected MOSFETs N11a and N11b are explicitly designed so as to be highly conductive (i.e., a relatively large aspect ratio W/L, for example on the order of 100 squares, where W is the channel width and L is the channel length), so as to ensure that a relatively low gate-to-source voltage of the cascode-connected MOSFETs is sufficient to sustain even a relatively high current sunk by the memory cells (e.g., 80 μA). Should in fact the cascode-connected MOSFET not be sufficiently conductive, the inverter IN1a or IN1b (fed by the IC supply voltage VDD) would not be capable of driving the gate of the cascode-connected MOSFET to the proper value, so that the MOSFET would not be able to sustain that current flow.

On the contrary, in this embodiment of the present invention, the cascode-connected MOSFETs N41a and N41b are specifically designed so as to be rather resistive (for example, at least 10 times or even more, and preferably approximately 100 times, more resistive, i.e., the cascode-connected MOSFETs N41a and N41b have aspect ratios W/L on the order of 10 squares or less, preferably down to only 1 square, with the specific aspect ratio of the cascode-connected MOSFETs N41a and N41b depending for example on the desired separation in voltage of the nodes MAT and REF, as well as on the value of the voltage supplying the inverters IN4a, IN4b).

The gate of the MOSFET a and the gate of the corresponding MOSFET N41b form the nodes MAT and REF, respectively, that are fed to the non-inverting and inverting inputs of the differential amplifier 125.

Compared to the structure of FIG. 1, the loads LDa and LDb have been eliminated, and the (current-to-voltage conversion) function of the loads LDa and LDb is now performed by the same cascode-connected MOSFETs N41a and N41b of the bit line voltage regulators 430a and 430b, respectively. In other words, the loads LDa and LDb are incorporated in the MOSFETs N41a and N41b, respectively. Stated differently, the current-to-voltage conversion of the matrix memory cell current I,m and the reference current I,r takes place on the gate of the MOSFETs N41a and N41b, respectively.

Due to the presence of the (negative) feedback, the bit line voltage regulators 430a and 430b regulate the voltage of the selected matrix bit line BL,m and the reference bit line BL,r to a value of approximately 1V (such a value depends on the threshold voltage of the pull-down, N-channel MOSFET of the inverter IN4a or IN4b), similarly to the bit line voltage regulators 130a and 130b of the known structures. However, due to the relatively high conductivity of the cascode-connected MOSFETs N11a and N11b, in the known structures the gate voltage of the MOSFET N11a varies only slightly with the matrix memory cell current I,m (and, similarly, the gate voltage of the cascode-connected transistor N11b varies only slightly with the reference current I,r). On the contrary, in the structure according to the embodiment of the present invention described here, the fact that the MOSFETs N41a and N41b are designed to be relatively resistive causes their gate voltage to vary significantly with the matrix memory cell current I,m and the reference current I,r, respectively. In other words, while in the known structures a gate voltage of the cascode-connected MOSFET substantially equal to 1V (the target bit line voltage) plus the relative low threshold voltage of the native MOSFETs is sufficient for sustaining a flow of current in the range of values of interest, in the structure according to this embodiment of the present invention the gate voltage of, for example, the MOSFET N41a goes subject to a relatively high swing depending on whether the selected matrix memory cell sinks a high current or not. For a given memory cell current, e.g., the average current I,m."1", depicted in FIG. 2A, the more resistive the MOSFET N41a, the higher the value of the respective gate-to-source voltage Vgs needed for sustaining that current (the same holds true for the MOSFET N41b).

As a consequence, while for a matrix memory cell programmed in the "0" (or the "00") state (corresponding to a low or substantially zero matrix memory cell current in the normal biasing conditions adopted for sensing) the value of the gate-to-source voltage Vgs is substantially equal to the threshold voltage of the MOSFET N41a, the value of the gate-to-source voltage Vgs rises significantly in the case in which the matrix memory cell is programmed to the "1" (or the "11") state, corresponding to the highest possible memory cell current value. In particular, by properly designing the MOSFET N41a, for example acting on the respective aspect ratio W/L, it is possible to cause the value of the MOSFET's gate-to-source voltage Vgs to swing from substantially the threshold voltage of the MOSFET N41a to substantially the supply voltage of the inverter IN4a.

The inverters IN4a and IN4b preferably receive, as a supply voltage, an inverter supply voltage $V_{HV}$, which is distributed by a voltage distribution rail $V_{HV}$. The inverter supply voltage $V_{HV}$ is preferably higher than the memory supply voltage VDD, which is received from the outside and distributed through the IC by the supply voltage distribution rail VDD. In particular, the voltage $V_{HV}$ is for example a boosted voltage generated by a charge-pump voltage booster 405, which is provided in the memory IC, from the memory supply voltage VDD. For example, assuming that the memory supply voltage VDD is approximately equal to 2.5V, a suitable boosted voltage $V_{HV}$ may be approximately equal to 6V (however, higher boosted voltage values may be used).

Thus, with this structure, the value of the gate-to-source voltage Vgs of the MOSFET N41a may swing from substantially the MOSFET's threshold voltage (e.g., approximately in the range 0.5V–0.7V) to substantially the boosted voltage $V_{HV}$, which is higher than the memory supply voltage VDD. The voltage at the node MAT may thus swing from substantially 1V plus the MOSFET's threshold voltage, to substantially the boosted voltage $V_{HV}$; since the boosted voltage may be significantly higher than the supply voltage VDD (for example, twice or more), a significant increase in the dynamic range for the inputs of the differential amplifier 125 is achieved.

Notably, the voltage booster 405 that feeds the inverters IN4a and IN4b does not have to deliver the currents (memory cell and reference cell currents, and charging currents for the bit line capacitances C,m and C,r) flowing through the sense amplifier circuit branches 420a and 420b, which are instead sunk from the supply voltage rail VDD, as in the known sensing circuit structures. Only the inverters IN4a and IN4b sink current from the voltage booster 405; in addition to a possibly very low static consumption (for example, in the case in which the inverters are of the CMOS type), a small dynamic current is needed for charging the tiny gate capacitance of the MOSFETs N41a and N41b (such a capacitance is far lower and far better controllable by the designer than the parasitic capacitance of the bit line). For example, by properly dimensioning the inverters IN4a and IN4b, it is possible to achieve current consumptions lower than approximately 15 μA, that, considering the exemplary degree of parallelism mentioned in the foregoing—70 memory cells—makes a total of approximately 1 mA; such a value, relatively low per se, can be further reduced by acting on the inverters' dimensions. As a consequence, the voltage booster 405 may be relatively small, occupy a limited area on the semiconductor chip, and dissipate limited power.

Figure 5A:
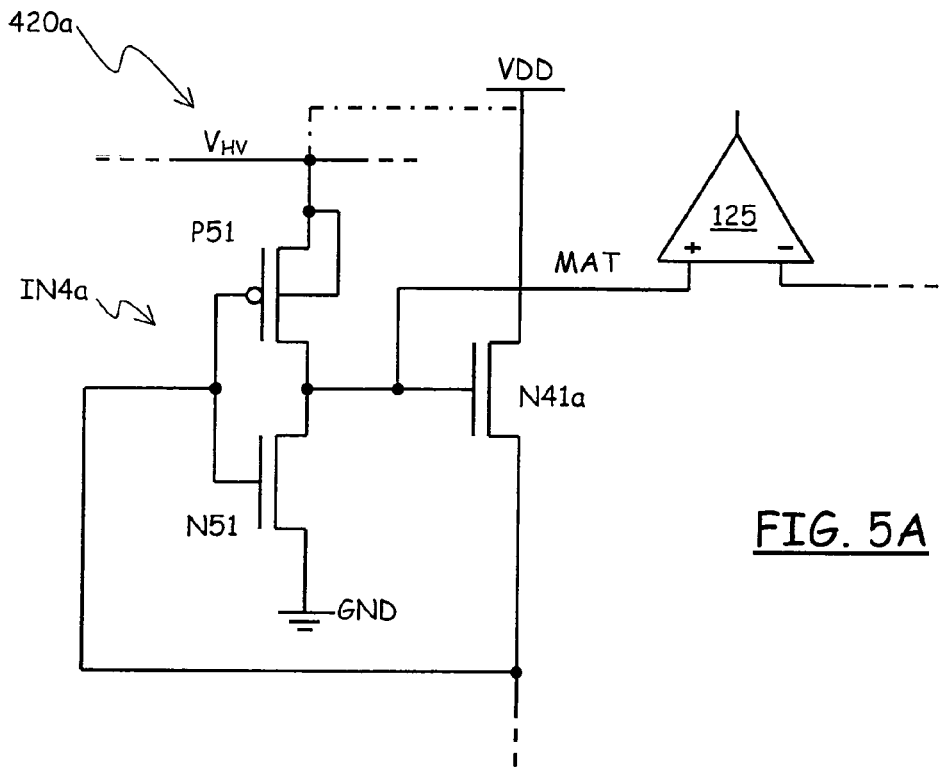
FIGS. 5A and 5B show implementations of the bit line voltage regulator of the sensing circuit structure of FIG. 4 according to two embodiments of the present invention.
Figure 5B:
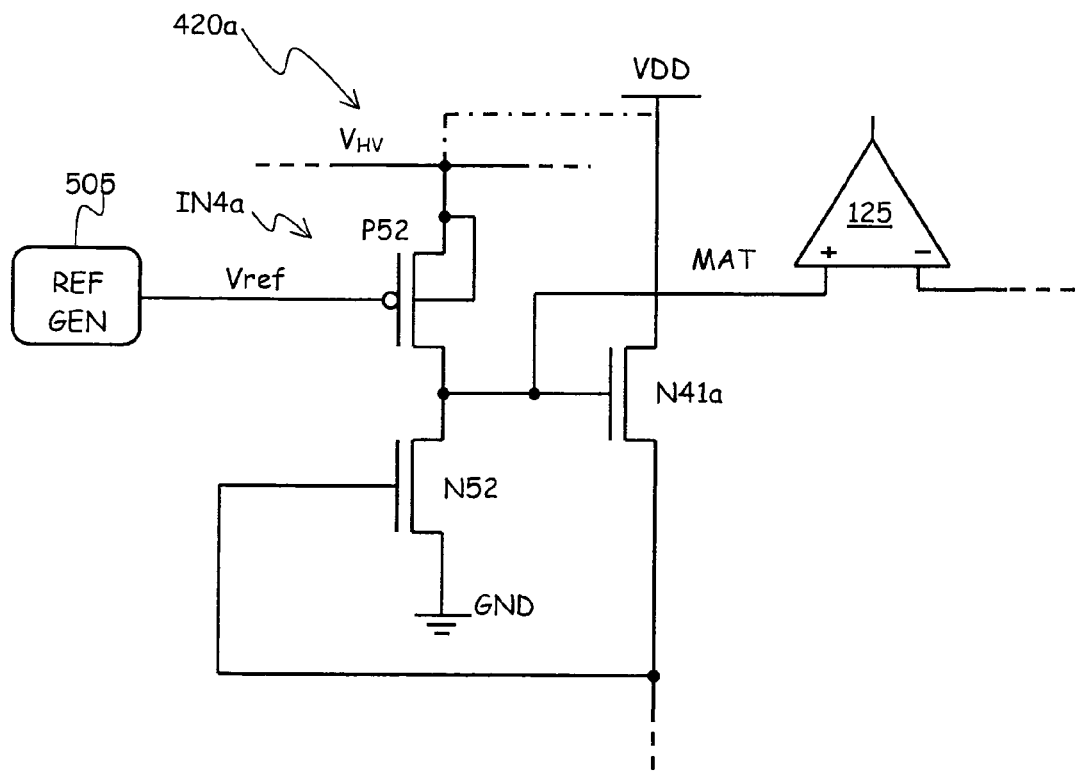

FIGS. 5A and 5B show two embodiments of the bit line voltage regulators 430a and 430b, particularly of the inverters IN4a and IN4b. In both of these figures, only one of the bit line voltage regulators 430a or 430b is shown, namely the bit line voltage regulators 430a, and the other bit line voltage regulator may be substantially identical.

In the embodiment of FIG. 5A, the inverter IN4a is a CMOS inverter comprising an N-channel MOSFET N51 and a P-channel MOSFET P51 connected in series between the boosted voltage rail $V_{HV}$ and the ground GND, with their gates short-circuited to each other. This structure has the advantage of exhibiting a very low static consumption.

The inverter structure of the embodiment of FIG. 5B is instead an active-load inverter comprising a switching N-channel MOSFET N52 in series with an active load formed by a P-channel MOSFET P52, whose gate receives a reference bias voltage Vref generated by a bias voltage generator 505, such as a bandgap reference voltage generator. This second embodiment has the advantage of involving a substantially constant current drainage from the boosted voltage supply rail $V_{HV}$.

Figure 6:
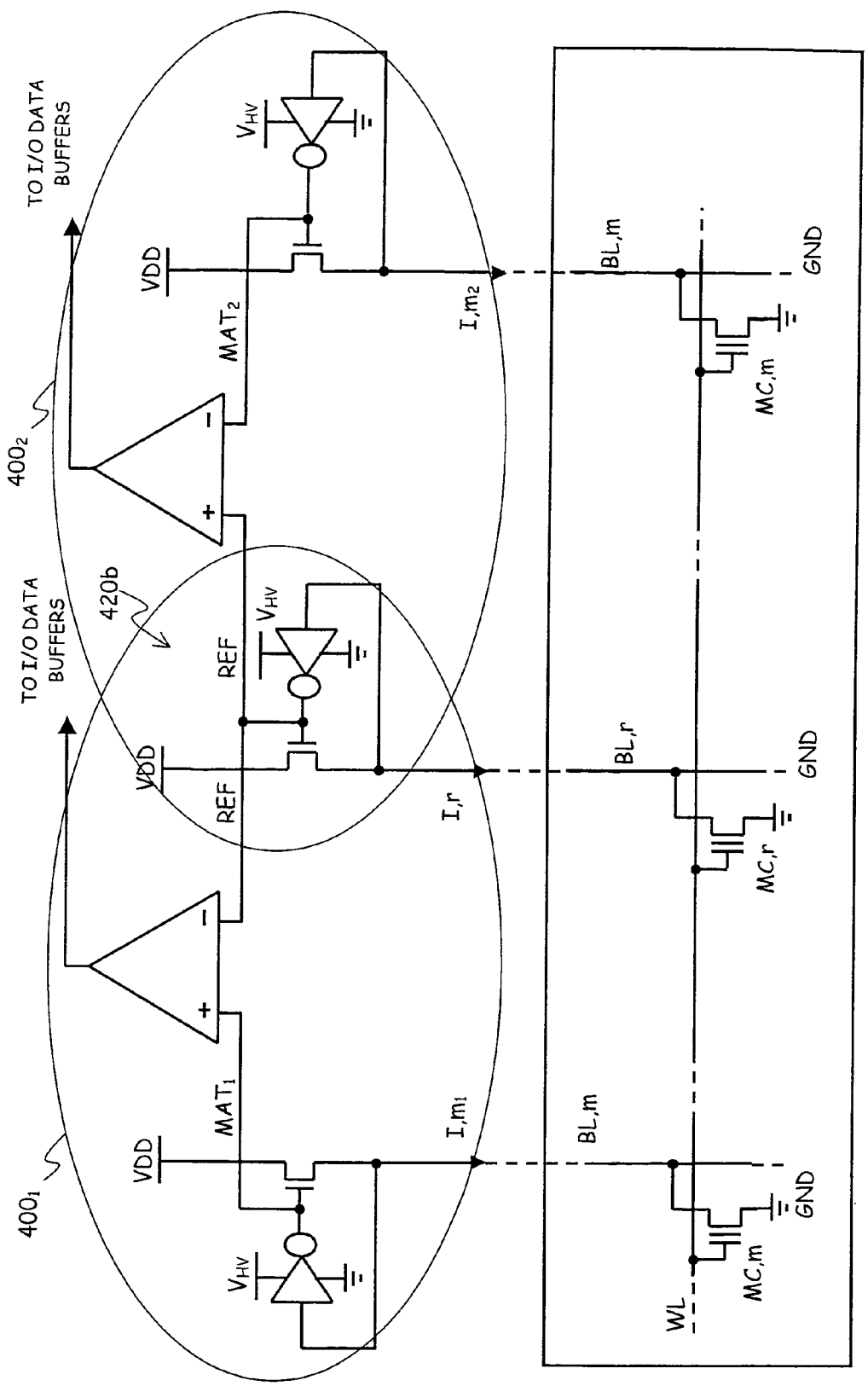
FIG. 6 shows a sensing circuit structure according to another embodiment of the present invention.

FIG. 6 shows another embodiment of the present invention in which, instead of having a reference memory cell for each matrix memory cell MC,m to be sensed, one reference memory cell MC,r is used for sensing two (as in the example shown) or more matrix memory cells MC,m. In particular, in the example shown, two sense amplifiers $400_1$ and $400_2$ of the type shown in FIG. 4, each of which is associated (through the bit line selector 115) with a respective selected matrix bit line BL,m, share a common reference memory cell MC,r, which is connected to a reference bit line BL,r. More specifically, the two sense amplifiers $400_1$ and $400_2$ share the second circuit branch 420b, which generates the voltage to be fed to the inverting input of the respective differential amplifiers.

Accordingly, the present invention makes it possible to reduce the semiconductor chip area needed for the integration of the sense amplifiers, compared to the known ones, because the number of components is reduced. In particular, compared to the structure of FIG. 1, the loads LDa and LDb in the two circuit branches of the sense amplifier can be eliminated, with their function being performed by the same elements (the cascode-connected MOSFETs N41a and N41b) that also regulate the bit lines voltage; compared to the structure of FIG. 3, the advantages are even more, because not only the loads but also the current mirrors can be eliminated, with a significant improvement in terms of occupied semiconductor chip area.

In addition, by causing the current-to-voltage conversion to take place at the control terminal of the elements (the MOSFETs N41a and N41b) that regulate the voltages of the bit lines, and by connecting the inputs of the differential amplifiers to such control terminals, the voltage dynamic of the differential amplifier inputs can be rendered independent from the value of the memory IC supply voltage VDD. In this way, by feeding the feedback network (the inverters IN4a and IN4b) in the bit line voltage regulator with a boosted voltage $V_{HV}$, which is higher than the memory supply voltage VDD (more generally, higher than the voltage from which the bit line current is sunk, that is, the voltage to which the sense amplifier circuit branches are connected), the dynamic range of the differential amplifier inputs can be expanded significantly, and substantially as desired.

Simulations we conducted have revealed that, in the same operating conditions (VDD=2.5V, T=90° C., and word-line read voltage Vread=5V) and matrix memory cell current distributions as those considered above, and assuming a boosted voltage $V_{HV}$=6V, the separation between the potentials at the nodes MAT and REF in the worst case is approximately 300 mV, while adopting either one of the known circuit structures the separation may be as low as 50 mV. The same simulations evidenced that, using the inverter structure of FIG. 5B, the current sunk from the boosted voltage line $V_{HV}$ is at most approximately equal to 15 μA for each inverter in each bit line voltage regulator circuit.

The present invention can be used in any semiconductor memory, for example (but not limitatively) in non-volatile memories such as ROMs, EPROMs, EEPROMs and Flash memories. The present invention is particularly suited for use in memories that are designed to operate with a single, low-value external supply (e.g., 3V or less), such as components designed for portable apparatuses (mobile phones, digital cameras, Personal Digital Assistants and the like). The present invention is also useful in the case of multi-level memories, those using a parallel sensing approach or a serial sensing approach, and is particularly suited for serial dichotomic sensing.

Although the present invention has been herein disclosed and described by way of some embodiments, it is apparent to those skilled in the art that several modifications to the described embodiments, as well as other embodiments of the present invention are possible without departing from the scope thereof, as defined in the appended claims.

For example, other types of transistors can be used, and it is not necessary that the second circuit branches of the sense amplifier are substantially identical to the first circuit branch.

Further, the reference voltage, which is to be fed to one of the inputs of the differential amplifier for being compared to the converted voltage signal obtained from the matrix memory cell current, may be generated in a different way, without using reference memory cells and current-to-voltage conversion arrangements.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A sensing circuit for sensing semiconductor memory cells, the sensing circuit comprising:
   at least one first circuit branch coupled to a memory cell to be sensed, so as to be run through by a current corresponding to a memory cell state;
   a feedback-controlled circuit element in the first circuit branch, the feedback-controlled circuit element controlling a memory cell access voltage;
   a current-to-voltage conversion circuit in the first branch, the current-to-voltage conversion circuit converting the current into a corresponding converted voltage signal that is indicative of the memory cell state; and
   at least one comparator for comparing the converted voltage signal with at least one comparison voltage for discriminating among at least two different states of the memory cell,
   wherein the converted voltage signal corresponds to a control signal of the feedback-controlled circuit element.

2. The sensing circuit according to claim 1, wherein the feedback-controlled circuit element also acts as the current-to-voltage conversion circuit.

3. The sensing circuit according to claim 2, further comprising at least one second circuit branch that is run through by a comparison current that corresponds to the comparison voltage.

4. The sensing circuit according to claim 3, wherein each of the second circuit branches comprises a current-to-voltage conversion circuit for converting the comparison current into the comparison voltage.

5. The sensing circuit according to claim 4,
   wherein each of the second circuit branches is coupled to at least one reference memory cell, and
   each of the second circuit branches comprises a feedback-controlled circuit element for controlling an access voltage to the reference memory cell.

6. The sensing circuit according to claim 5, wherein the comparison voltage corresponds to a control signal of the feedback-controlled circuit element in the second circuit branch.

7. The sensing circuit according to claim 1, further comprising at least one second circuit branch that is run through by a comparison current that corresponds to the comparison voltage.

8. The sensing circuit according to claim 1, further comprising a feedback network for controlling the feedback-controlled circuit element, the feedback network generating the control signal for the feedback-controlled circuit element.

9. The sensing circuit according to claim 8,
wherein the first circuit branch is coupled between a supply voltage and a reference voltage, and
the feedback network generates the control signal so as to be variable in a voltage range that is wider than the supply voltage.

10. The sensing circuit according to claim 9, wherein the feedback network includes a driver circuit element for the feedback-controlled circuit element.

11. The sensing circuit according to claim 10, wherein the driver circuit element is an inverting driver circuit element.

12. The sensing circuit according to claim 11, wherein the inverting circuit element is supplied by a voltage that is higher than the supply voltage.

13. The sensing circuit according to claim 12, wherein the voltage supplying the inverting circuit element is a boosted voltage that is generated from the supply voltage.

14. The sensing circuit according claim 1,
wherein the comparison voltage comprises a plurality of comparison voltages for discriminating more than two memory cell states.

15. The sensing circuit according claim 1,
wherein the at least one first circuit branch comprises at least two first circuit branches that are each coupled to a respective memory cell to be sensed,
the at least one comparator comprises at least two comparators,
one of the at least two first circuit branches is coupled to a first of the at least two comparators,
another of the at least two first circuit branches is coupled to a second of the at least two comparators, and
the first and second comparators receive the at least one comparison voltage.

16. A semiconductor memory device including memory cells and at least one sensing circuit for sensing the memory cells, the sensing circuit comprising:

at least one first circuit branch coupled to a memory cell to be sensed, so as to be run through by a current corresponding to a memory cell state;
a feedback-controlled circuit element in the first circuit branch, the feedback-controlled circuit element controlling a memory cell access voltage;
a current-to-voltage conversion circuit in the first branch, the current-to-voltage conversion circuit converting the current into a corresponding converted voltage signal that is indicative of the memory cell state; and
at least one comparator for comparing the converted voltage signal with at least one comparison voltage for discriminating among at least two different states of the memory cell,
wherein the converted voltage signal corresponds to a control signal of the feedback-controlled circuit element.

17. The semiconductor memory device according to claim 16, wherein the feedback-controlled circuit element of the sensing circuit also acts as the current-to-voltage conversion circuit of the sensing circuit.

18. The semiconductor memory device according to claim 17, wherein the sensing circuit further comprises at least one second circuit branch that is run through by a comparison current that corresponds to the comparison voltage.

19. The semiconductor memory device according to claim 16, wherein the sensing circuit further comprises a feedback network for controlling the feedback-controlled circuit element, the feedback network generating the control signal for the feedback-controlled circuit element.

20. A method of sensing a memory cell, the method comprising:
causing the memory cell to be sensed to sink a memory cell current that is indicative of the memory cell state;
converting the memory cell current into a corresponding voltage signal; and
comparing the converted voltage signal to at least one comparison voltage,
wherein the causing step comprises regulating an access voltage to the memory cell through a regulation element that is controlled by a regulation signal, and
the converted voltage signal is derived by the regulation signal that controls the regulation element.

* * * * *